United States Patent
Park et al.

(10) Patent No.: US 6,611,679 B1
(45) Date of Patent: Aug. 26, 2003

(54) DEVICE AND METHOD FOR CONTROLLING A RECEIVING AMPLIFIER IN A RADIO TERMINAL

(75) Inventors: Jae-Sun Park, Suwon-Shi (KR); Hong-Kyu Kim, Suwon-shi (KR)

(73) Assignee: Samsung Electronics Co., Ltd. (KR)

( * ) Notice: Subject to any disclaimer, the term of this patent is extended or adjusted under 35 U.S.C. 154(b) by 490 days.

(21) Appl. No.: 09/585,737

(22) Filed: Jun. 2, 2000

(30) Foreign Application Priority Data

Jun. 23, 1999 (KR) .................................... 99-23776

(51) Int. Cl.$^7$ ................................................ H04B 1/06
(52) U.S. Cl. ................ 455/245.1; 455/250.1; 455/343; 330/278; 330/127
(58) Field of Search .......................... 455/232.1, 234.1, 455/245.1, 230, 245.2, 248.1, 250.1, 253.2, 254, 226.1, 226.3, 226.4, 343; 330/254, 278, 296, 127, 130

(56) References Cited

U.S. PATENT DOCUMENTS

| | | | | |
|---|---|---|---|---|
| 5,001,776 A | * | 3/1991 | Clark | 455/226.2 |
| 5,179,724 A | * | 1/1993 | Lindoff | 455/76 |
| 6,311,048 B1 | * | 10/2001 | Loke | 455/245.1 |

* cited by examiner

Primary Examiner—Lester G. Kincaid
Assistant Examiner—Ronald J. Ward
(74) Attorney, Agent, or Firm—Dilworth & Barrese, LLP

(57) ABSTRACT

A device for controlling a receiving amplifier in a radio terminal by monitoring the transmission/reception mode and varying the current to an amplifier that amplifies an output signal to vary the linearity of the amplifier according to a received signal strength indicator (RSSI) measured of the input signal and a measured input signal quality.

8 Claims, 4 Drawing Sheets

DEVICE AND METHOD FOR CONTROLLING A RECEIVING AMPLIFIER IN A RADIO TERMINAL

BACKGROUND OF THE INVENTION

1. Field of the Invention

The present invention relates generally to a device and method for controlling a receiving amplifier in a radio terminal, and in particular, to a device and method for preventing performance degradation of a radio terminal due to cross modulation occurring in a receiver.

2. Description of the Related Art

FIG. 1 shows a receiver of an existing radio terminal. As illustrated, the radio terminal receives not only a pure signal but also a noise signal at a low noise amplifier 130, so that there occurs cross modulation in the low noise amplifier 130. In addition, when a receiver shares an antenna with a transmitter using a duplexer (not shown), the radio terminal has the following problems. Since the duplexer cannot completely isolate the receiver from the transmitter, a transmission signal output from the transmitter (not shown) may be induced into the low noise amplifier 130 of the receiver, causing cross modulation. The cross modulation decreases the performance of the radio terminal.

Thus, the receiver cannot properly decode a received signal having low strength. To solve this problem, it is necessary to improve performance of a receiving amplifier. A simple method of improving performance of the receiving amplifier is to increase input current so as to improve linearity of the amplifier. However, in the prior art device, a constant current is applied to the amplifier, resulting in inefficient current consumption. Therefore, receiving performance cannot adapt to the radio environment, thereby causing a data loss.

SUMMARY OF THE INVENTION

It is, therefore, an object of the present invention to provide a device and method for improving receiving performance of a radio terminal.

It is another object of the present invention to provide a device and method for decreasing power consumption of a radio terminal.

It is further another object of the present invention to provide a device and method for adaptively controlling performance of an amplifier according to a radio environment.

It is still further another object of the present invention to provide a device and method for performing demodulation with minimized signal loss.

It is yet another object of the present invention to provide a device and method for reducing current consumption with minimized signal loss.

To achieve the above objects, there is disclosed a device for controlling a receiving amplifier in a radio-terminal. The device comprises at least one amplifier for amplifying an input signal, the linearity of the amplifier being dependent on an amount of current supplied thereto; a received signal strength indicator (RSSI) measurer for measuring RSSI of the input signal; a variable power supply for controlling an amount of the current supplied to the amplifier in response to a control signal; a signal quality analyzer for measuring a quality of the input signal; and a power controller for generating said control signal according to a transmission/reception mode, the measured RSSI and the measured signal quality. The amplifier includes a low noise amplifier and an intermediate frequency (IF) amplifier.

BRIEF DESCRIPTION OF THE DRAWINGS

The above and other objects, features and advantages of the present invention will become more apparent from the following detailed description when taken in conjunction with the accompanying drawings in which.

DETAILED DESCRIPTION OF THE PREFERRED EMBODIMENT

A preferred embodiment of the present invention will be described herein below with reference to the accompanying drawings. In the following description, well-known functions or constructions are not described in detail since they would obscure the invention in unnecessary detail.

A detailed description of the invention will be made hereinbelow with reference to FIGS. 2 to 5.

Figure 1:
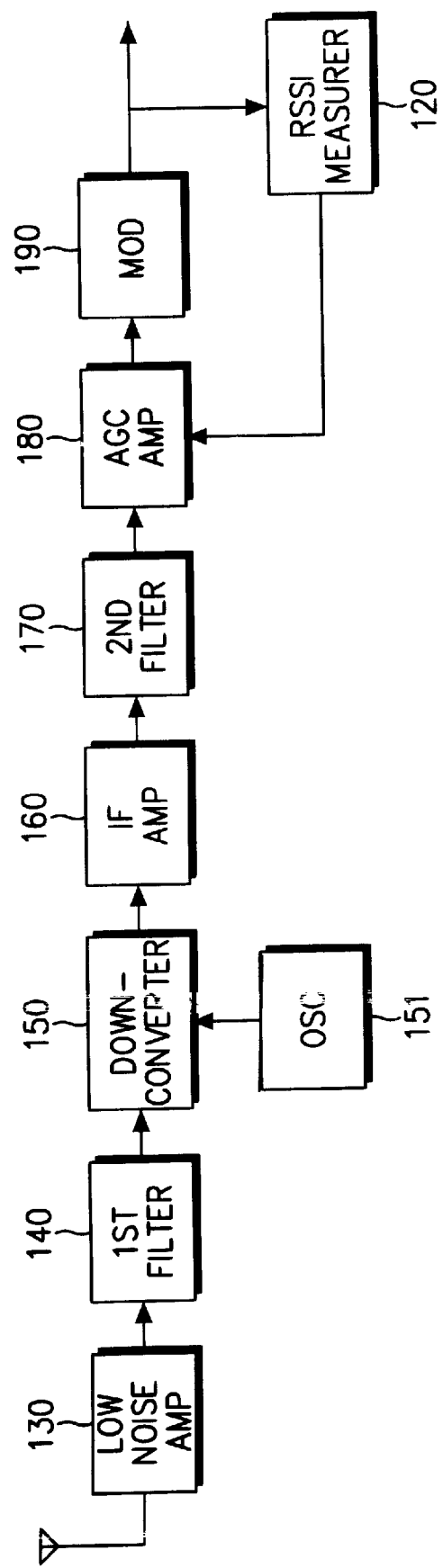
FIG. 1 is a block diagram illustrating a receiver of a radio terminal according to the prior art.
Figure 2:
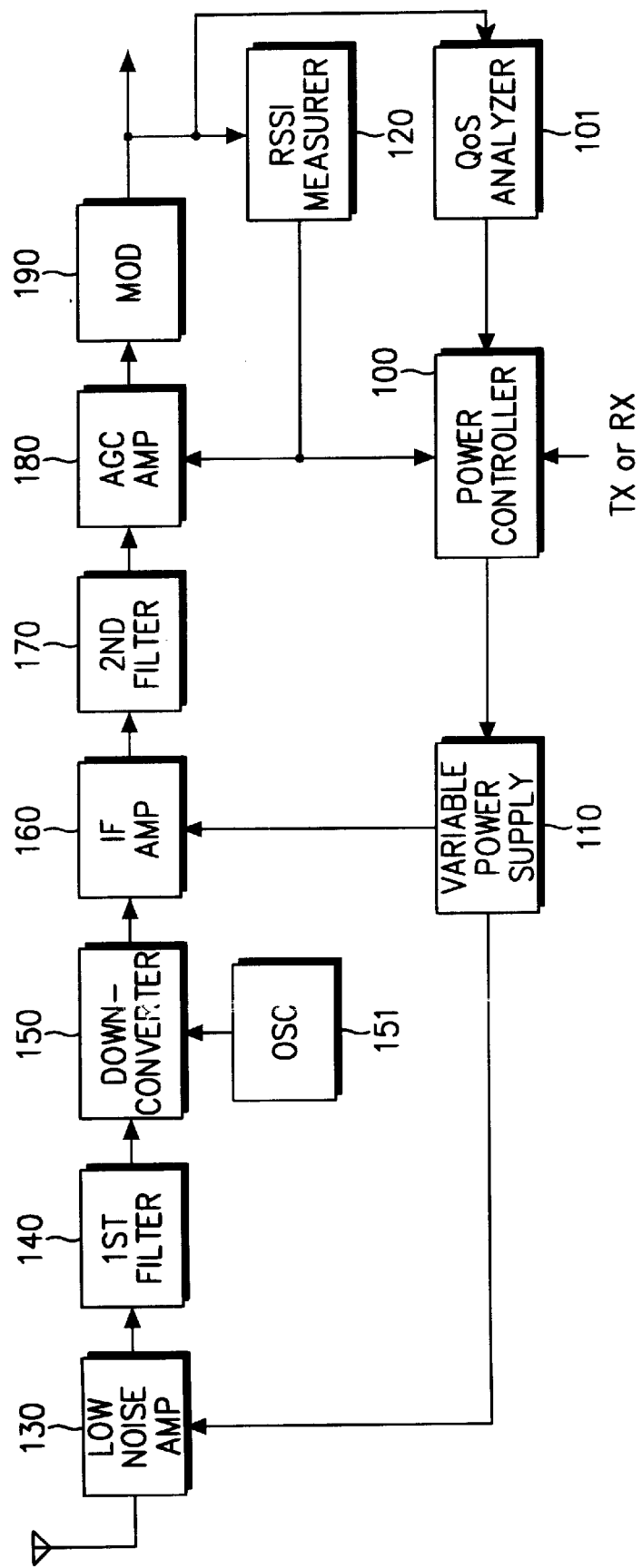
FIG. 2 is a block diagram illustrating a receiver of a radio terminal according to an embodiment of the present invention.
Figure 4:
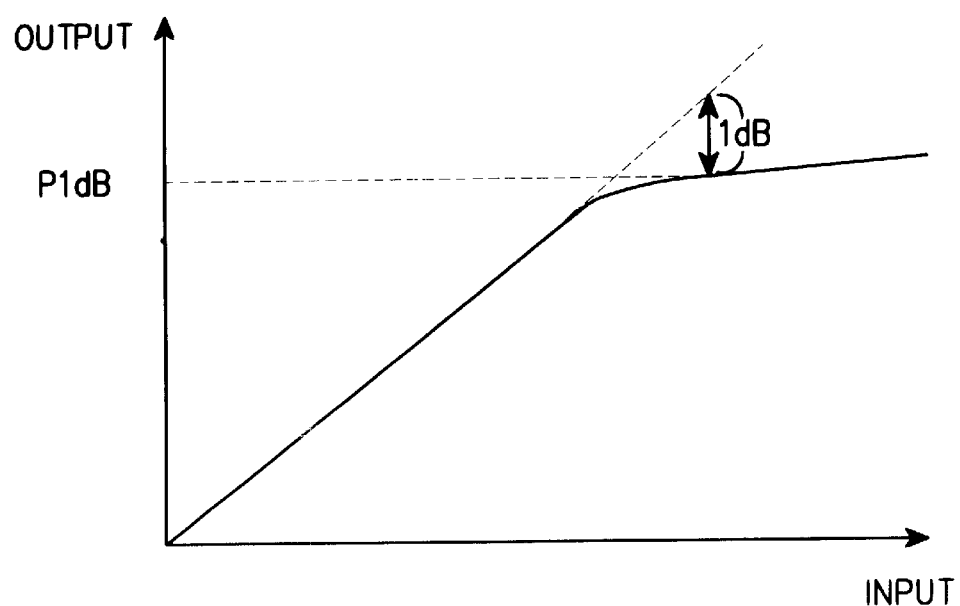
FIG. 4 is a graph illustrating an input-to-output characteristic of an amplifier.
Figure 5:
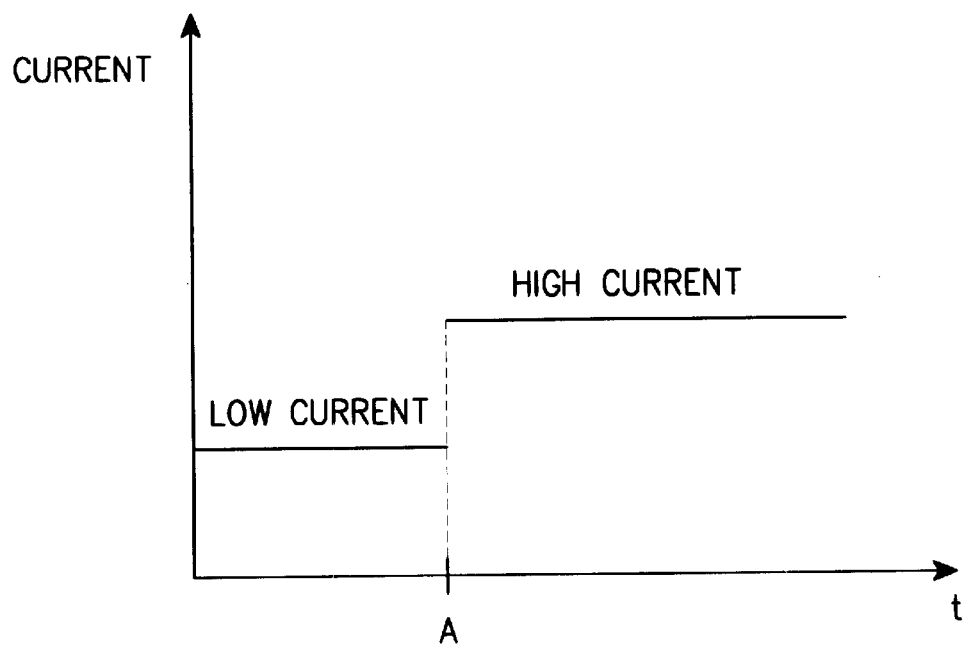
FIG. 5 is a graph illustrating a characteristic of a current received at an amplifier according to an embodiment of the present invention.

Referring to FIG. 2, a power controller 100 varies a current being supplied to amplifiers in the receiver of the radio terminal depending on a transmission/reception state, a received signal strength indicator (RSSI) and a quality of signal (QoS). The receiving amplifiers have a linearity which depends on the current supplied thereto, and includes a low noise amplifier 130 for amplifying an input signal and an intermediate frequency (IF) amplifier 160 for amplifying an IF signal. Commonly, the characteristic of amplifiers is determined by variation of an output signal with respect to an input signal, as shown in FIG. 4. When a high current is supplied to the amplifiers, the input-to-output characteristic curve of the amplifiers is straightened at a P1dB point of FIG. 4, thereby increasing the linearity. An RSSI measurer 120 analyzes a received signal to measure RSSI. In a CDMA (Code Division Multiple Access) system, the RSSI is measured using a pilot signal. A signal quality (QoS) analyzer 101 measures a signal-to-noise ratio for an input signal. When employing digital modulation, the signal quality analyzer determines the signal quality depending on the ratio of signal energy to noise energy with respect to each data bit. In addition, the signal quality analyzer 101 examines the signal quality using CRC (Cyclic Redundancy Check). A variable power supply 110, under the control of a power controller 100, controls the current being supplied to the low noise amplifier 130 and the IF amplifier 160 in response to a control signal A, as shown in FIG. 5.

Figure 3:
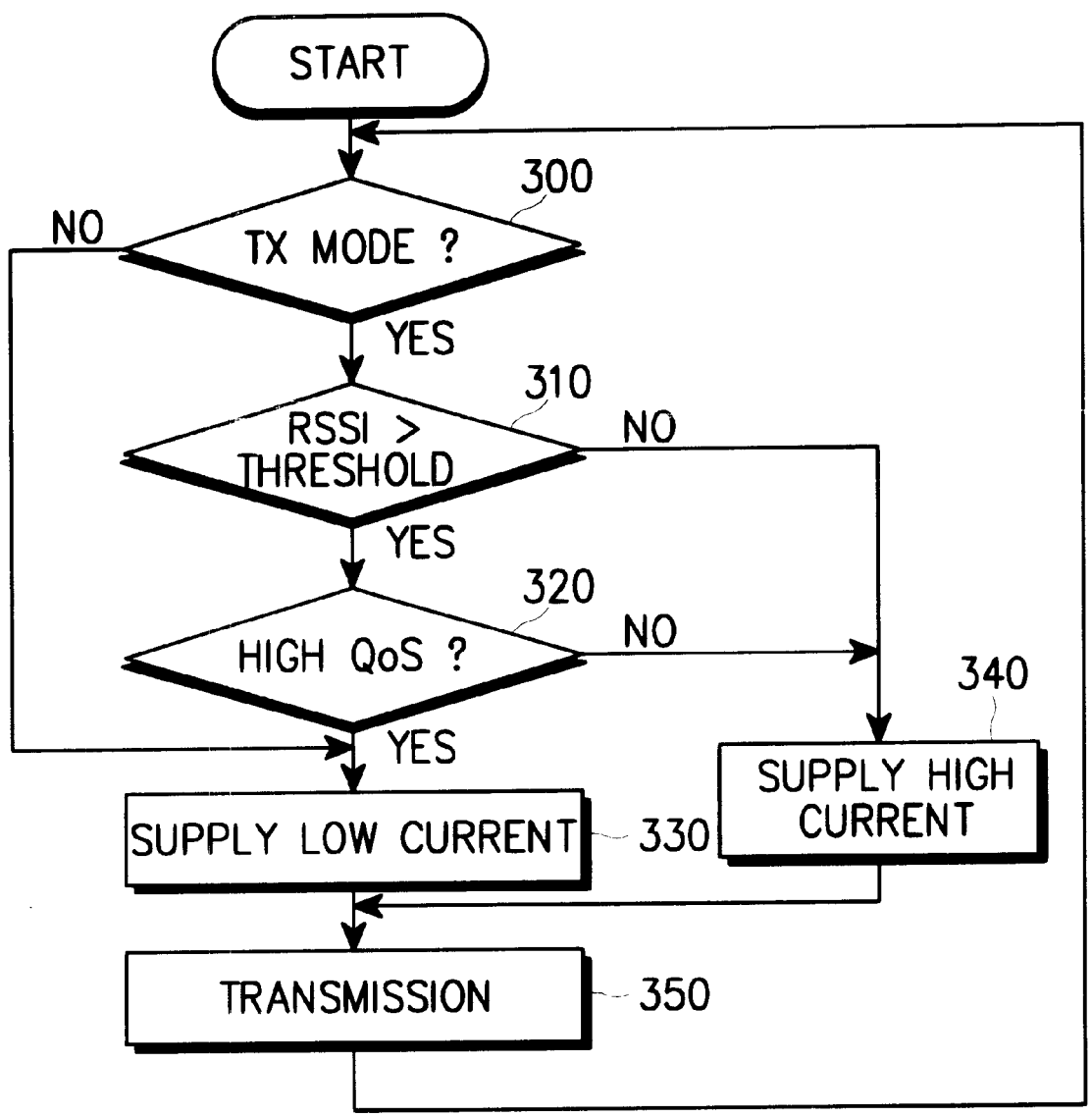
FIG. 3 is a flow chart illustrating a method for controlling the receiver according to an embodiment of the present invention.

Referring to FIG. 3, power controller 100 examines in step 300 whether the radio terminal is presently in a transmission mode of operation. When the radio terminal is in the transmission mode, power controller 100 examines in step 310 whether the RSSI measured by the RSSI measurer 120 is higher than or equal to a threshold. When the RSSI is higher than or equal to the threshold, the power controller

100 examines in step 320 whether the signal quality measured by the signal quality analyzer 101 is high enough. As described above, the signal quality is determined according to the signal-to-noise ratio and the CRC. When the signal quality is high, the power controller 100 controls the variable power supply 110 so as to supply a low current to the receiving amplifiers of the radio terminal. That is, since the quality of the received signal is high, the receiver demodulates the received signal even though the current supplied to the amplifiers is low. In this manner, it is possible to decrease power consumption in the radio terminal. When the signal quality is low in step 320, the power controller 100 supplies the high current to the amplifiers to increase an amplification ratio so as to prevent data loss during demodulation, in step 340. If the RSSI is not higher than or equal to a threshold in step 310, the process proceeds directly to step 340. Thereafter, the power controller 100 performs a transmission operation in step 350, and then returns to step 300.

In summary, when RSSI is low during transmission, the external noises and the transmission signal may be induced into the receiving amplifiers, causing cross modulation. To prevent this, the power controller 100 supplies the high current to the amplifiers. However, when the RSSI is high, the external noises and the transmission signal which are induced into the receiving amplifiers are negligible, so that the receiver can properly demodulate the received signal even with the normal low current. In this manner, it is possible to reduce power consumption.

While the invention has been shown and described with reference to a certain preferred embodiment thereof, it will be understood by those skilled in the art that various changes in form and details may be made therein without departing from the spirit and scope of the invention as defined by the appended claims.

What is claimed is:

1. A device for controlling a receiving amplifier in a radio terminal, comprising:

at least one amplifier for amplifying an input signal, the linearity of the amplifier being dependent on an amount of current supplied thereto;

a received signal strength indicator (RSSI) measurer for measuring RSSI of the input signal;

a variable power supply for controlling an amount of the current supplied to the amplifier in response to a control signal;

a signal quality analyzer for measuring a quality of the input signal; and a power controller for generating said control signal during a transmission mode according to the measured RSSI and the measured signal quality, wherein said control signal indicates whether the measured RSSI and the measured signal quality are lower than a threshold during the transmission mode.

2. The device as claimed in claim 1, wherein the amplifier is a low noise amplifier.

3. The device as claimed in claim 1, wherein the amplifier is an intermediate frequency (IF) amplifier.

4. The device as claimed in claim 1, wherein the amplifier includes a low noise amplifier and an IF amplifier.

5. The device as claimed in claim 1, wherein the variable power supply supplies a high current or a low current to the amplifier according to the control signal.

6. The device claimed in claim 1, wherein the variable power supply further:

causes a high current to be supplied to the amplifier when the measured RSSI is lower than the threshold; and causes a low current to be supplied to the amplifier when the measured RSSI is higher than or equal to the threshold.

7. A method for controlling a receiving amplifier in a radio terminal including at least one amplifier for amplifying an input signal, the linearity of the amplifier being dependent on an amount of current supplied thereto, a variable power supply for controlling an amount of the current supplied to the amplifier in response to a control signal, a signal quality analyzer for measuring a quality of the input signal, and an RSSI measurer for measuring RSSI of the input signal, the method comprising the steps of:

(a) examining whether the radio terminal is in a transmission mode of operation;

(b) measuring RSSI of the input signal when the radio terminal is in the transmission mode and measuring a quality of the input signal when the measured RSSI is higher than or equal to a threshold; and (c) varying current being supplied to the amplifier according to the measured RSSI and signal quality, supplying a low current to the amplifier and returning to step (a) when the measured signal quality is higher than or equal to the threshold and supplying a high current to the amplifier and returning to step (a) when the measured RSSI and signal quality are lower than the threshold.

8. The method as claimed in claim 7, wherein the variable power supply supplies the low current to the amplifier when the radio terminal is not in the transmission mode of operation.

* * * * *